United States Patent
Lim et al.

(10) Patent No.: US 10,896,955 B2
(45) Date of Patent: Jan. 19, 2021

(54) SEMICONDUCTOR DEVICE INCLUDING A FUNCTIONAL LAYER AND A METHOD OF FABRICATING THE SAME

(71) Applicant: SAMSUNG ELECTRONICS CO., LTD., Suwon-si (KR)

(72) Inventors: Kangmook Lim, Seoul (KR); Sang Su Kim, Yongin-si (KR); Woo Seok Park, Ansan-si (KR); Sung Gi Hur, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/401,347

(22) Filed: May 2, 2019

(65) Prior Publication Data
US 2020/0135848 A1 Apr. 30, 2020

(30) Foreign Application Priority Data
Oct. 29, 2018 (KR) .................. 10-2018-0130032

(51) Int. Cl.
| | |
|---|---|
| H01L 27/01 | (2006.01) |
| H01L 29/06 | (2006.01) |
| H01L 21/8238 | (2006.01) |
| H01L 29/423 | (2006.01) |
| H01L 29/786 | (2006.01) |
| H01L 21/762 | (2006.01) |
| H01L 29/66 | (2006.01) |
| H01L 21/02 | (2006.01) |
| H01L 27/092 | (2006.01) |
| H01L 29/78 | (2006.01) |

(52) U.S. Cl.
CPC .... *H01L 29/0649* (2013.01); *H01L 21/02532* (2013.01); *H01L 21/02603* (2013.01); *H01L 21/76237* (2013.01); *H01L 21/823807* (2013.01); *H01L 21/823821* (2013.01); *H01L 21/823828* (2013.01); *H01L 21/823878* (2013.01); *H01L 27/092* (2013.01); *H01L 27/0924* (2013.01); *H01L 29/0673* (2013.01); *H01L 29/42392* (2013.01); *H01L 29/66545* (2013.01); *H01L 29/66742* (2013.01); *H01L 29/66795* (2013.01); *H01L 29/7851* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 6,541,351 B1 | 4/2003 | Bartlau et al. | |
| 7,772,649 B2 | 8/2010 | Cheng et al. | |
| 8,546,209 B1 | 10/2013 | Cheng et al. | |

(Continued)

*Primary Examiner* — Hung K Vu
(74) *Attorney, Agent, or Firm* — F. Chau & Associates, LLC

(57) ABSTRACT

A semiconductor device includes a substrate, an active region disposed on the substrate and extending in a first direction, a device isolation layer adjacent to the active region, a gate structure disposed in the active region, the gate structure extending in a second direction crossing the first direction, and covering a portion of the device isolation layer, a gate separation pattern contacting an end of the gate structure, and an impurity region disposed below the gate separation pattern and on the device isolation layer.

17 Claims, 19 Drawing Sheets

(56) References Cited

U.S. PATENT DOCUMENTS

| | | | |
|---|---|---|---|
| 9,184,088 B2* | 11/2015 | Huang | H01L 21/02321 |
| 9,601,567 B1* | 3/2017 | Hsieh | H01L 21/82348 |
| 9,679,985 B1 | 6/2017 | Wu et al. | |
| 10,157,746 B2* | 12/2018 | Hsieh | H01L 21/32139 |
| 2010/0308382 A1 | 12/2010 | Johnson et al. | |
| 2017/0033196 A1 | 2/2017 | Greene et al. | |
| 2017/0040328 A1* | 2/2017 | Park | H01L 21/82382 |
| 2017/0365676 A1* | 12/2017 | Wu | H01L 29/4991 |
| 2018/0145131 A1 | 5/2018 | Wang et al. | |
| 2018/0151413 A1 | 5/2018 | Sung et al. | |

\* cited by examiner

SEMICONDUCTOR DEVICE INCLUDING A FUNCTIONAL LAYER AND A METHOD OF FABRICATING THE SAME

CROSS-REFERENCE TO RELATED APPLICATION

This application claims priority under 35 U.S.C. § 119 to Korean Patent Application No. 10-2018-0130032 filed on Oct. 29, 2018 in the Korean Intellectual Property Office, the disclosure of which is incorporated by reference herein in its entirety.

TECHNICAL FIELD

Example embodiments of the present disclosure relate to a semiconductor device, and more specifically, to a semiconductor device including a functional layer and a method of fabricating the same.

DISCUSSION OF RELATED ART

Demand for a highly integrated, high performance, high speed, multifunctional semiconductor device has increased. A highly integrated semiconductor device may include patterns having a minimal width or minimal intervals therebetween. To overcome a short channel effect, a fin field effect transistor (FinFET) or a gate-all-around (GAA) transistor that has a three dimensional channel has been proposed.

SUMMARY

According to example embodiments of the inventive concept, a semiconductor device may include a substrate, an active region disposed on the substrate and extending in a first direction. A device isolation layer may be disposed adjacent to the active region. A gate structure may be disposed on the active region. The gate structure may extend in a second direction crossing the first direction and cover a portion of the device isolation layer. A gate separation pattern may contact an end of the gate structure. An impurity region may be disposed below the gate separation pattern and in the device isolation layer.

According to example embodiments of the inventive concept, a semiconductor device may include a substrate and a plurality of active region disposed on the substrate. A device isolation layer may be disposed adjacent to the plurality of active regions. A plurality of gate structures may at least partially overlap the plurality of active regions and contact the device isolation layer. A gate separation pattern may be disposed between adjacent gate structures of the plurality of gate structures and on the device isolation layer. A low etch-rate region may be disposed between the gate separation pattern and the device isolation layer, wherein the low etch-rate region has a lower etch-rate than the device isolation layer.

According to example embodiments of the inventive concepts, a method of fabricating a semiconductor device may include forming a fin structure on a substrate, the fin structure including a plurality of sacrificial layers and a plurality of channel layers alternately stacked, forming a device isolation layer at least partially surrounding a lower portion of the fin structure, forming a dummy gate structure on the fin structure and extending onto the device isolation layer, forming source/drains at opposite sides of the dummy gate structure, forming an opening in the dummy gate structure, and forming an impurity region by injecting an impurity into the device isolation layer through the opening to form an impurity region. The impurity region has a lower etch-rate than the device isolation layer.

DETAILED DESCRIPTION OF THE EMBODIMENTS

Example embodiments of the present disclosure will now be described more fully with reference to the accompanying drawings. However, the inventive concepts may be embodied in many alternate forms and should not be construed as limited to only example embodiments of the present disclosure set forth herein.

Figure 1:
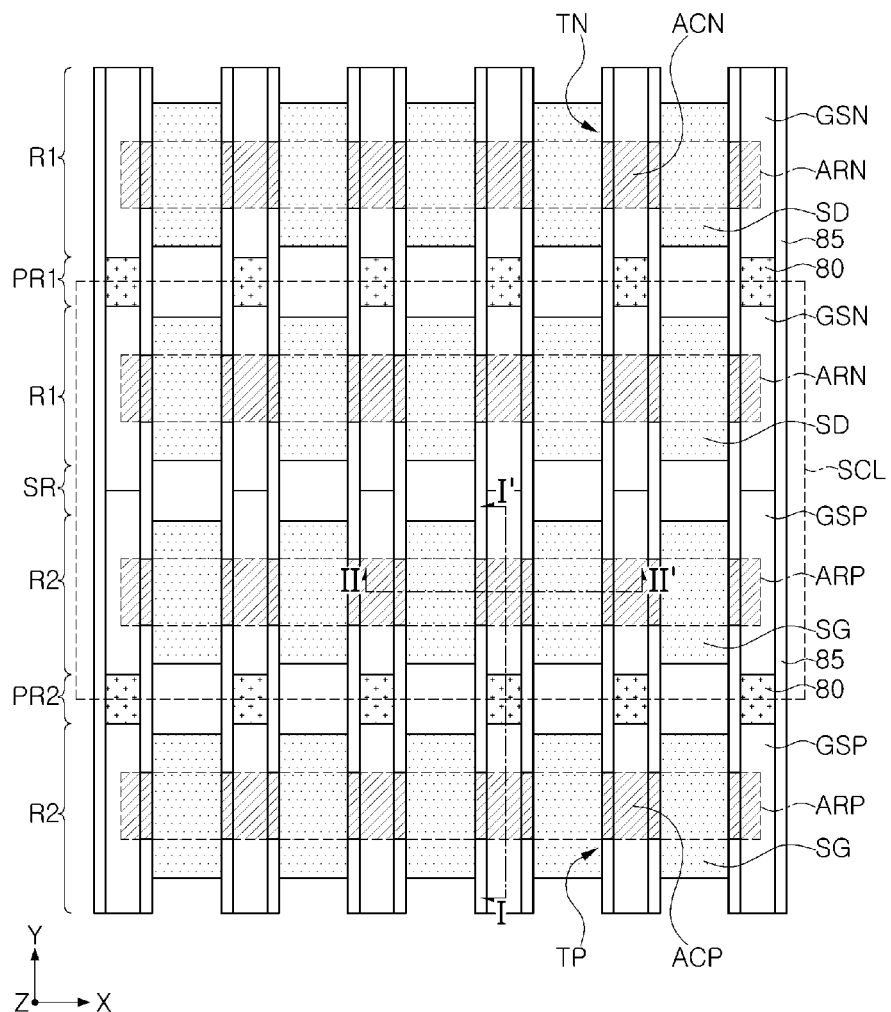
FIG. 1 is a layout diagram illustrating a semiconductor device according to example embodiments of the present disclosure.
Figure 2:
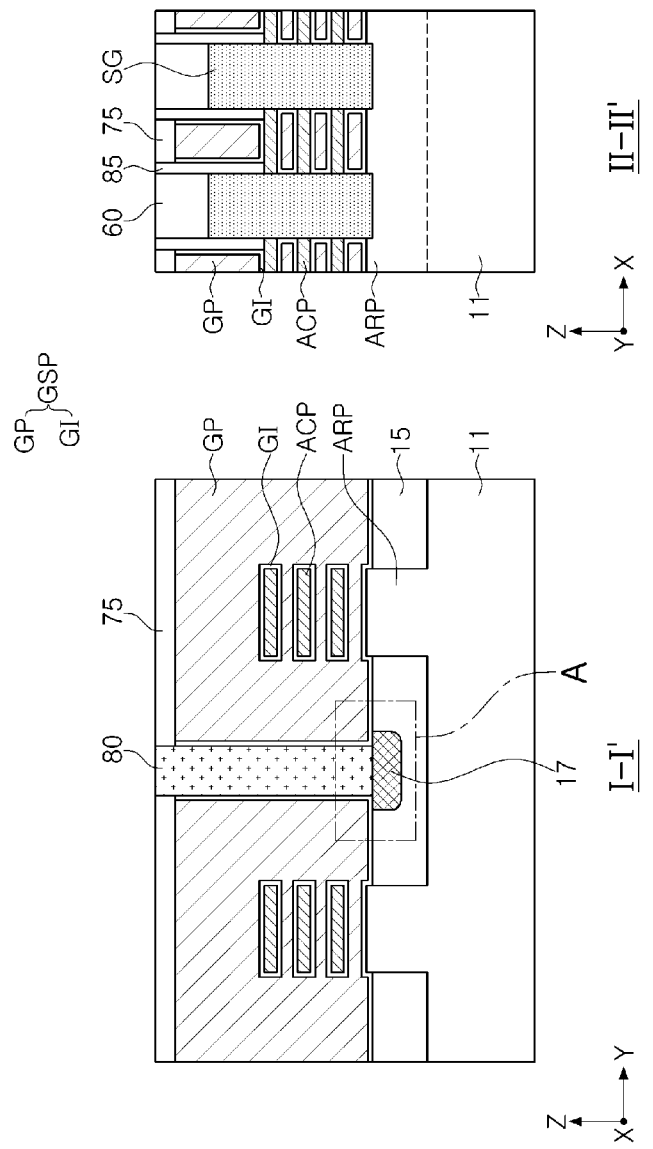
FIG. 2 is a cross-sectional view taken along lines I-I' and II-II' of FIG. 1, illustrating a semiconductor device according to example embodiments of the present disclosure.

FIG. 1 is a layout diagram illustrating a semiconductor device according to example embodiments of the present disclosure. FIG. 2 is a cross-sectional view taken along lines I-I' and II-II' of FIG. 1, illustrating a semiconductor device according to example embodiments of the present disclosure.

Referring to FIG. 1, a semiconductor device, according to example embodiments of the present disclosure, may include logic standard cells SCL provided on a substrate 11 (shown in FIG. 2). The logic standard cells SCL may each include a first device region R1, a second device region R2, a separation region SR between the first device region R1 and the second device region R2, a first power rail region PR1 adjacent the first device region R1, and a second power rail region PR2 adjacent the second device region R2.

N-type transistors TN may be disposed in the first device region R1, and p-type transistors TP may be disposed in the second device region R2. The n-type transistors TN and the p-type transistors TP may each be a transistor of gate-all-around structure (GAA).

In the first device region R1, a first lower active region ARN extends in a first direction X. First gate structures GSN extend in a second direction Y crossing the first direction X to cross the first lower active region ARN. First source/drains SD may be disposed between the first gate structures GSN. The second device region R2 may include a second lower active region ARP extending in the first direction X, second gate structures GSP that extend in the second direction Y to cross the second lower active region ARP, and second source/drains SG disposed between the second gate structures GSP. First channel layers ACN may be disposed on the first lower active region ARN between the first source/drains SD. The first gate structure GSN may at least partially surround the first channel layers ACN. Second channel layers ACP may be disposed on the second lower active region ARP between the second source/drain regions SG. The second gate structure GSP may at least partially surround the second channel layers ACP. The first lower active region ARN and the first channel layers ACN may include a p-type dopant. The second lower active region ARP and the second channel layers ACP may include an n-type dopant. The first source/drains SD may include the n-type dopant, and the second source/drains SG may include the p-type dopant.

The n-type transistors TN may each include the first channel layers ACN, the first gate structure GSN, and the first source/drains SD. The p-type transistors TP may each include the second channel layers ACP, the second gate structure GSP, and the second source/drains SG.

The first gate structures GSN and the second gate structures GSP may contact each other in the separation region SR.

The semiconductor device may include gate separation patterns 80 disposed in the first power rail region PR1 and the second power rail region PR2.

The gate separation patterns 80 may respectively be disposed between the first gate structures GSN adjacent to each other in the second direction Y, and between the second gate structures GSP adjacent to each other in the second direction Y. Opposite ends of the adjacent first gate structures GSN may contact the gate separation patterns 80 in the first power rail region PR1, and opposite ends of the adjacent second gate structures GSP may contact the gate separation patterns 80 in the second power rail region PR2.

Spacers 85 may be disposed on sidewalls of the first gate structures GSN and sidewalls of the second gate structures GSP. The spacers 85 may continuously extend in the second direction Y along the sidewalls of the first gate structures GSN and the sidewalls of the second gate structures GSP.

The first source/drains SD disposed between the first gate structures GSN and the second source/drains SG between the second gate structures GSP may contact the spacers 85.

Contact plugs may be disposed on the first source/drains SD and on the second source/drains SG.

In the first power rail region PR1, a first power rail may be disposed extending parallel to the first lower active regions ARN in the first direction X, and in the second power rail region PR2, a second power rail may be disposed extending parallel to the second lower active regions ARP. The first power rail and the second power rail may be positioned at a higher level than the upper surfaces of the first and second gate structures GSN and GSP. Alternatively, the first power rail and the second power rail may be positioned at a lower level than lower surfaces of the first and second gate structures GSN and GSP. The first power rail and the second power rail may include a conductive material, such as a metal. The first power rail and the second power rail may provide a power source voltage or a ground voltage. For example, the first power rail may provide the power source voltage, and the second power rail may provide the ground voltage.

Referring to FIG. 2, the semiconductor device may include the substrate 11. The second lower active region ARP may protrude from the substrate 11 and a device isolation layer 15 may be disposed between the second lower active regions ARP. The second channel layers ACP may be arranged at predetermined vertical intervals spaced in a third direction Z on the second lower active region ARP. The second gate structures GSP may surround the second channel layers ACP and may be arranged adjacent to each other in the second direction Y. The gate separation pattern 80 may be disposed between the second gate structures GSP. An impurity region 17 may be disposed below the gate separation pattern 80. According to an example embodiment of the present disclosure, the impurity region 17 may have substantially the same width as the gate separation pattern 80 in the X direction. The second source/drains SG may be disposed between the second gate structures GSP and contact the second channel layers ACP. For example, the second source/drains SG may be disposed between parallel second gate structures GSP in the first direction X. A gate capping layer 75 may be disposed on each of the second gate structures GSP. Each of the second gate structures GSP may include a second gate electrode GP, and a gate insulation layer GI disposed between the second gate electrode GP and each of the second channel layers ACP. For example, a gate insulation layer GI may cover substantially the entire surface of each of the second channel layers ACP when viewed on a plane formed by the second direction Y and third direction Z.

The substrate 11 may include a group IV semiconductor, such as silicon, germanium, silicon-germanium, a group III-V compound semiconductor, and/or a group II-VI compound semiconductor. In some example embodiments of the present disclosure, the substrate 11 may be a silicon-on-insulator (SOI) substrate or a germanium-on-insulator (GOI) substrate.

The second channel layers ACP may each include a nanosheet, of which a width is greater than a thickness. For example, the length of extension in the second direction Y may exceed the length of extension in the third direction Z. The second channel layers ACP may include a semiconductor material, such as silicon and/or germanium. The number of the second channel layers ACP may be as shown in FIG. 2 (stack of three on each second lower active region ARP), but the present disclosure is not limited thereto.

The second gate structures GSP may each surround the second channel layers ACP, and may at least partially overlap the device isolation layer 15 in the second direction Y.

The second gate electrode GP may include a metal, a metal nitride, and/or doped polysilicon. In example embodiments of the present disclosure, the second gate electrode GP may include titanium nitride (TiN), titanium aluminum (TiAl), titanium aluminum nitride (TiAlN), tantalum nitride (TaN), tantalum aluminum nitride (TaAlN), titanium aluminum carbide (TiAlC), and/or tungsten nitride (WN).

The gate insulation layer GI may at least partially surround surfaces of the second channel layers ACP. For example, the gate insulation layer GI may envelop substantially the entire perimeter of the second channel layers ACP when viewed on a plane formed by the second direction Y and the third direction Z. The gate insulation layer GI may further be disposed between the second lower active region ARP and the second gate electrode GP, the second gate electrode GP and the device isolation layer 15, and between the second gate electrode GP and the gate separation pattern 80. The gate insulation layer GI may include at least one of silicon oxide, silicon nitride, silicon oxynitride, and/or a high-k dielectric material. The high-k dielectric material may be a dielectric material having a dielectric constant higher than that of silicon oxide, for example, aluminum oxide ($Al_2O_3$), tantalum oxide ($Ta_2O_3$), titanium oxide ($TiO_2$), yttrium oxide ($Y_2O$), zirconium oxide ($ZrO_2$), zirconium silicon oxide (ZrSixOy), hafnium oxide (HfOz), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), and/or praseodymium oxide ($Pr_2O_3$).

An interfacial insulation layer may further be disposed between each of the second channel layers ACP and the gate insulation layer GI. The interfacial insulation layer may include an oxide, such as silicon oxide.

The gate separation pattern 80 may be disposed between the second gate structures GSP adjacent to each other in the second direction Y. Opposite ends of the adjacent second gate structures GSP may contact the gate separation pattern 80. The gate separation pattern 80 may include, for example, silicon nitride, silicon oxynitride, and/or a combination thereof. The gate separation pattern 80 may include stacked lower and upper layers. For example, the lower layer may be formed of silicon nitride, and the upper layer may be formed of silicon oxide.

The impurity region 17, having an etch rate lower than an etch rate of the device isolation layer 15, may be formed below the gate separation pattern 80. The impurity region 17 may refer to a low etch-rate region. For example, the device isolation layer 15 may include silicon oxide, and the impurity region 17 may further include Si, B, He, P, C and/or a combination thereof. The impurity region 17 may include an impurity at a concentration of $1\times10^{19}$ atoms/cm$^3$ or more. For example, the impurity region 17 may include an impurity at a concentration of $1\times10^{20}$ atoms/cm$^3$ to $1\times10^{22}$ atoms/cm$^3$.

The second channel layers ACP may be disposed between the second source/drains SG, and the second source/drains SG may contact the second channel layers ACP. The source/drains SG may be formed of, for example, silicon-germanium including (doped with) boron (B). The source/drains SG may each include a plurality of silicon-germanium layers including different compositions of germanium. The plurality of silicon-germanium layers may include different boron concentrations.

The spacers 85 may be disposed on sidewalls of each of the second gate structures GSP, and may be formed of an insulation material. The gate capping layer 75 may include, for example, a nitride, such as silicon nitride.

The contact plugs may be disposed on the second source/drains SG. The contact plugs may penetrate the interlayer insulation layer 60 to contact the second source/drains SG. The interlayer insulation layer 60 may include, for example, silicon oxide.

Figure 3:
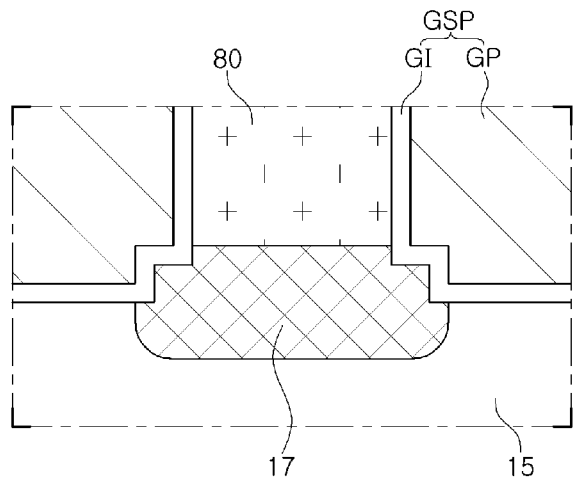
FIGS. 3 and 4 are cross-sectional views illustrating a portion of a semiconductor device according to example embodiments of the present disclosure and are enlarged views of portion 'A' of FIG. 2.
Figure 4:
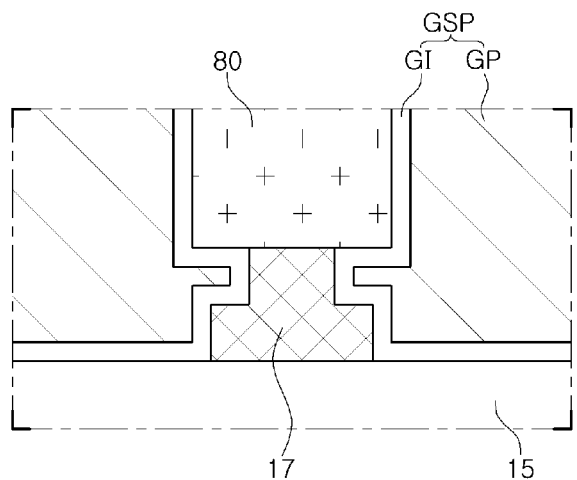

FIGS. 3 and 4 are cross-sectional views of a portion of a semiconductor device according to example embodiments and are enlarged views of portion 'A' of FIG. 2.

Referring to FIG. 3, an upper surface of the impurity region 17 may contact a lower surface of the gate separation pattern 80, and a lower portion of the impurity region 17 may have a width greater than the width of the gate separation pattern 80. For example, a lower surface of the gate separation pattern 80 may include a width narrower in the second direction Y than the width of a lower portion of the impurity region 17 in the second direction Y. A sidewall of the impurity region 17 may include a stepped portion. The upper surface of the impurity region 17 may be higher than an upper surface of a portion of the device isolation layer 15 covered by (or contacting) the second gate structure GSP. A lower surface of the second gate structure GSP may be lower than the lower surface of the gate separation pattern 80.

Referring to FIG. 4, an upper surface of the impurity region 17 may contact the lower surface of the gate separation pattern 80, and an upper portion of the impurity region 17 may have a width smaller than the width of the gate separation pattern 80. For example, the term "width" as used herein may refer to a length of extension in the second direction Y. A sidewall of the impurity region 17 may include a stepped portion. The upper surface of the impurity region 17 may be higher than an upper surface of a portion of the device isolation layer 15 covered by (or contacting) the second gate structure GSP. A lower surface of the second gate structure GSP may be lower than the lower surface of the gate separation pattern 80. For example, a portion of the second gate structure GSP may extend below a lower surface of the gate separation pattern 80 and at least partially surround the lower surface of the gate separation pattern 80. The portion of the second gate structure GSP may be disposed between the gate separation pattern 80 and a lower portion of the impurity region 17.

Although example embodiments of the impurity region 17 according to the present disclosure have been shown in the figures and described above, it shall be understood that the present disclosure is not limited thereto. For example, the impurity region 17 may include various shapes, such as a tapered portion or a sheet-like structure that extends in the Z direction and connects to the gate separation pattern 80.

FIGS. 5 to 12 are cross-sectional views of a method of fabricating a semiconductor device according to example embodiments of the present disclosure, and respectively correspond to a cross-sectional view taken along lines I-I' and II-II' of FIG. 1.

Figure 5:
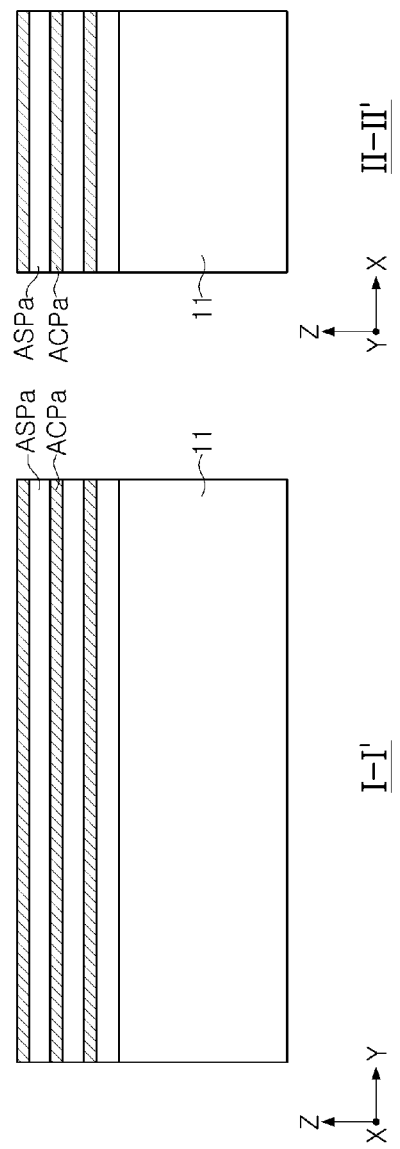
FIGS. 5 to 12 are cross-sectional views illustrating a method of fabricating a semiconductor device according to example embodiments of the present disclosure and correspond to cross-sectional views taken along lines I-I' and II-II' of FIG. 1.

Referring to FIG. 5, a plurality of sacrificial material layers ASPa and a plurality of channel material layers ACPa may be alternately stacked on substrate 11.

For example, a first sacrificial material layer ASPa may be formed first on the substrate 11, and a first channel material layer ACPa may be formed on the first sacrificial material layer ASPa. Next, a second sacrificial material layer ASPa may be formed on the first channel material layer ACPa. Thereafter, a second channel material layer ACPa may be formed on the second sacrificial material layer ASPa. As shown in FIG. 5, three sacrificial material layers ASPa and three channel material layers ACPa may be formed on the substrate 11, but the incentive concepts are not limited thereto. The number of the sacrificial material layers ASPa and the channel material layers ACPa may be variously modified.

The plurality of channel material layers ACPa may include a semiconductor material and may include a material having a different etch selectivity from the sacrificial material layers ASPa. The plurality of channel material layers ACPa may include silicon. The plurality of sacrificial material layers ASPa may include silicon-germanium. For example, the plurality of sacrificial material layers ASPa may each include silicon-germanium having a germanium content of 30%.

A thickness of each channel material layer ACPa and a thickness of each sacrificial material layer ASPa may be varied according to example embodiments. For example, each channel material layer ACPa and each sacrificial material layer ASPa may have a thickness on the order of several nm to several tens of nm. For example, each thickness may be between 1 nm and 100 nm. The thickness of each sacrificial material layer ASPa may be greater than the thickness of each channel material layer ACPa.

Figure 6:
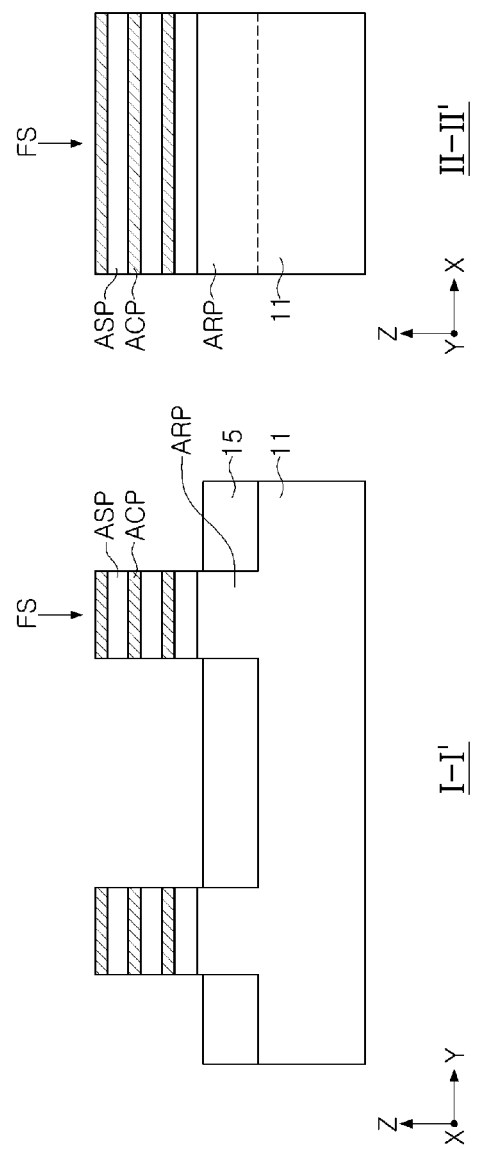

Referring to FIG. 6, portions of the plurality of channel material layers ACPa and portions of the plurality of sacrificial material layers ASPa, and a portion of the substrate 11 may be etched to form a fin structure FS. The fin structure FS may extend in the first direction X on the substrate 11.

The fin structure FS may be formed by forming a mask pattern on the substrate 11 on which the plurality of channel material layers ACPa and the plurality of sacrificial material layers ASPa were formed and performing an anisotropic etching process. The fin structure FS may include a plurality of channel layers ACP and a plurality of sacrificial layers ASP that are alternately stacked on each other. In the process of forming the fin structure FS, the portion of the substrate 11 may be etched to form the lower active region (i.e., the second lower active region) ARP protruding from substrate 11. The lower active region ARP of the substrate 11 may comprise the fin structure FS which includes the plurality of channel layers ACP and the plurality of sacrificial layers ASP. The plurality of channel layers ACP may refer to upper active regions. The device isolation layer 15 may be formed in a region in which the portion of the substrate 11 is etched. The device isolation layer 15 may partly cover a sidewall of the lower active region ARP. An upper surface of the device isolation layer 15 may be lower than an upper surface of the lower active region ARP. For example, an upper portion of the lower active region ARP may protrude above the device isolation layer 15. The device isolation layer 15 may include silicon oxide.

After the forming of the fin structure FS and the device isolation layer 15, the mask pattern may be removed.

Figure 7:
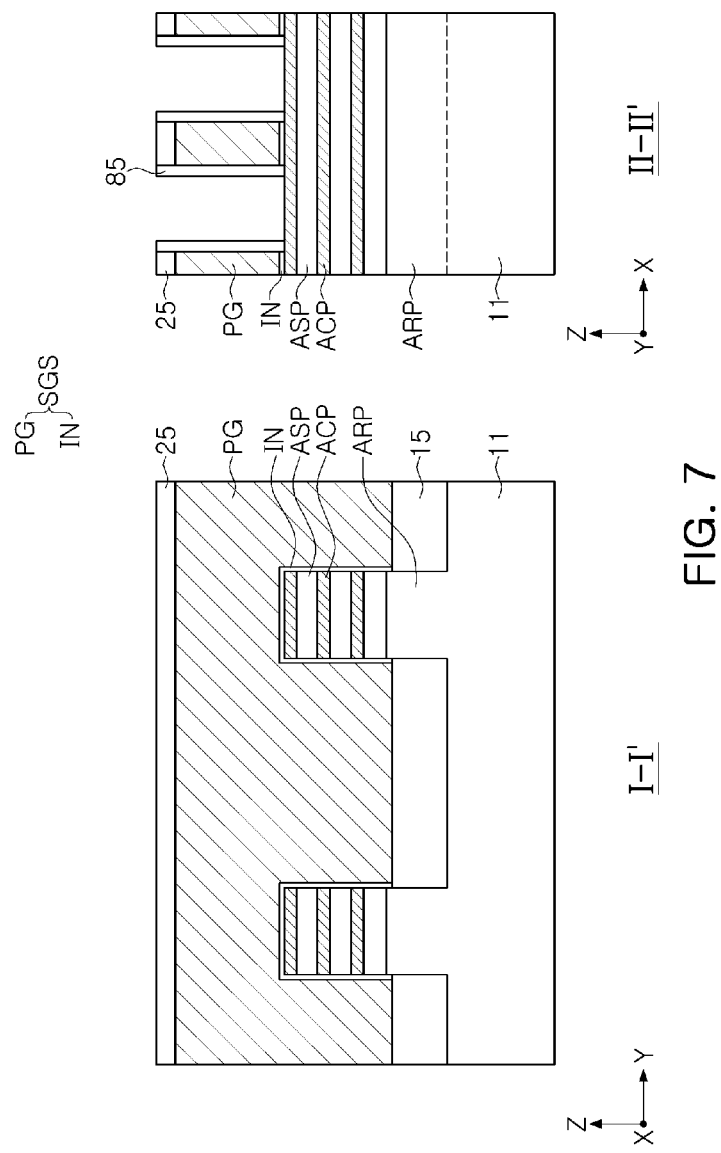

Referring to FIG. 7, dummy gate structures SGS may be formed to traverse the fin structure FS. The spacers 85 may be formed on sidewalls of the dummy gate structures SGS. The dummy gate structures SGS may each include a dummy gate electrode PG and a dummy insulation layer IN between the dummy gate electrode PG and the fin structure FS. A capping layer 25 may be formed on the dummy gate electrode PG.

The dummy gate structures SGS may be arranged at predetermined intervals spaced in the first direction X. The dummy gate structures SGS may cover an upper portion of the fin structure FS and the device isolation layer 15 and may extend in the second direction Y. The spacers 85 may extend in parallel to each of the dummy gate structures SGS. For example, the spacers 85 may extend in the second direction Y and at least partially overlap the dummy gate structure SGS.

The dummy gate electrode PG may be formed of a semiconductor material, such as polysilicon. The dummy insulation layer IN may be formed of silicon oxide. The spacers 85 may be formed of silicon oxynitride (SiON), silicon nitride (SiN), SiOC, SiOCN and/or SiBCN.

Figure 8:
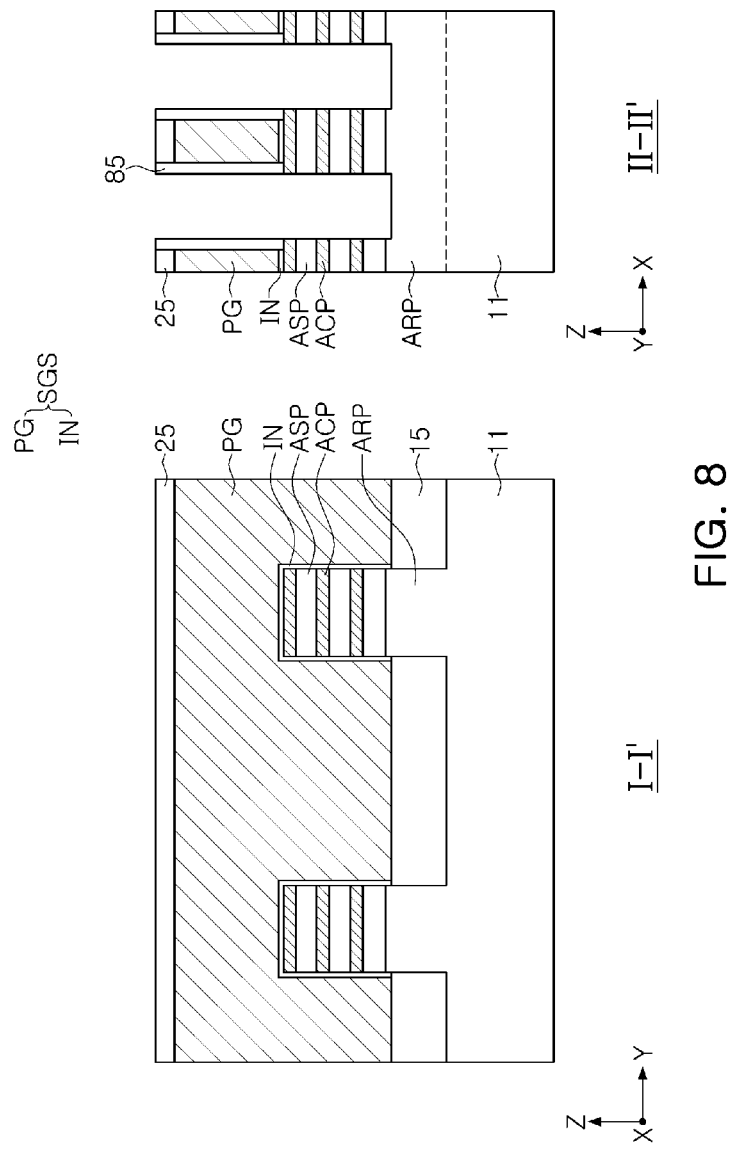

Referring to FIG. 8, a portion of the fin structure FS may be removed by an anisotropic dry etching process using the capping layer 25, the dummy gate structure SGS, and the spacers 85 as an etch mask to form recesses between the dummy gate structures SGS.

The recesses may be formed by removing portions of the plurality of channel layers ACP and the plurality of sacrificial layers ASP using the anisotropic dry etching process. The lower active region ARP may be exposed by the recesses. A portion of the lower active region ARP may be etched by the anisotropic etch process.

Figure 9:
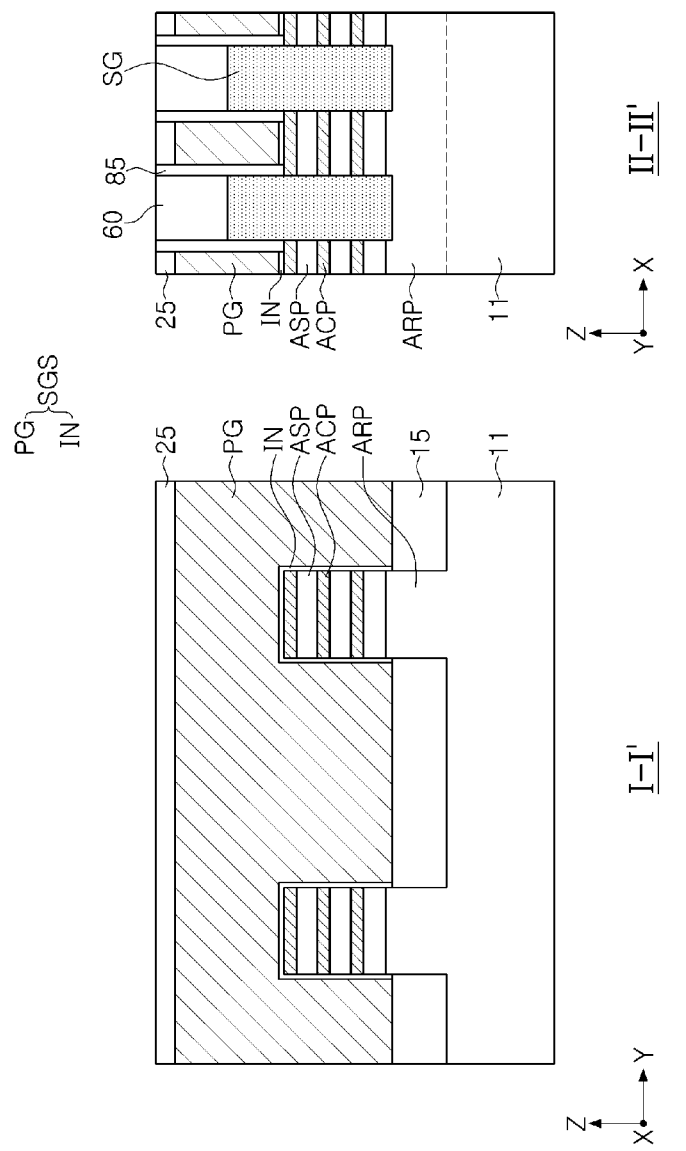

Referring to FIG. 9, the source/drains (i.e., the second source/drains) SG may be formed in the recesses by a selective epitaxial growth process using the lower active region ARP as a seed.

The source/drains SG may be doped with p-type impurities. The p-type impurities may be injected in-situ during the selective epitaxial growth process or may be injected by a subsequent ion implantation process. The source/drains SG may be formed of silicon-germanium including boron (B). The source/drains SG may be formed of a plurality of silicon-germanium layers having different germanium contents. The plurality of silicon-germanium layers may include different boron concentrations from each other. The interlayer insulation layer 60 may fill spaces between the spacers 85.

Figure 10:
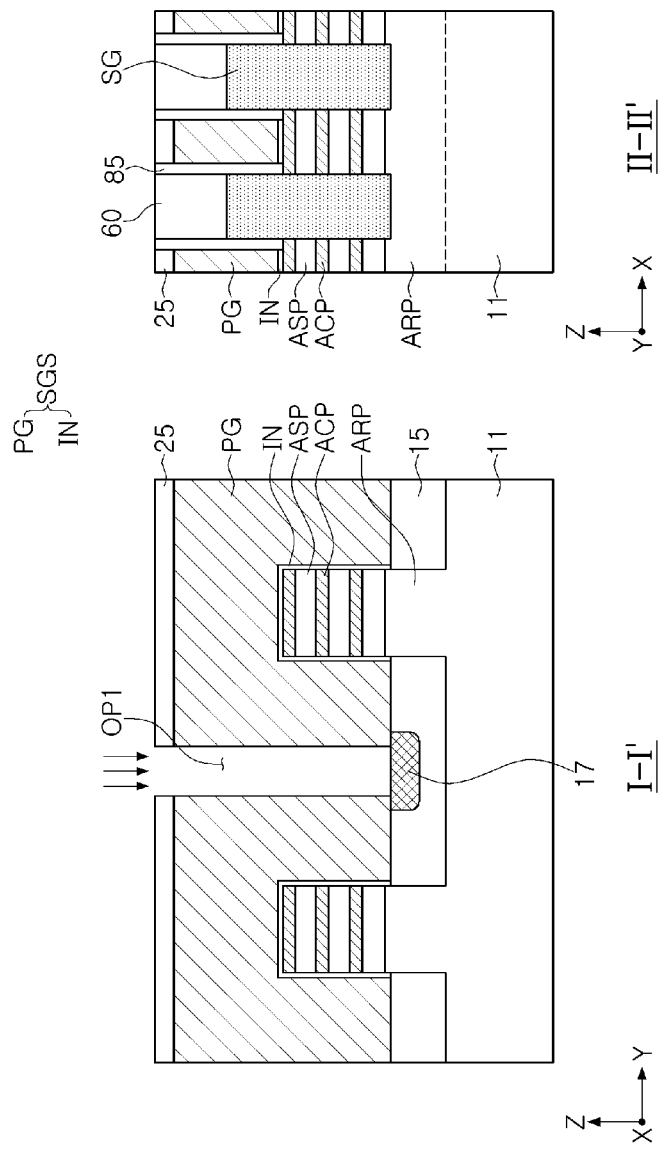

Referring to FIG. 10, the capping layer 25 and the dummy gate electrode PG may be etched to form a first opening OP.

The first opening OP1 may be formed by forming a mask pattern on the capping layer 25 and the interlayer insulation layer 60 and etching the capping layer 25 and the dummy gate electrode PG by an anisotropic etching process using the mask pattern as an etch mask. The first opening OP1 may expose the device isolation layer 15. The mask pattern may be removed after forming the first opening OP1.

Impurities may be injected into an upper portion of the exposed device isolation layer 15 by an ion implantation process to form the impurity region 17. The impurities may include Si, B, He, P and/or C. For example, the device isolation layer 15 may include silicon oxide, and the impurity region 17 may further include Si, B, He, P and/or C compared to the device isolation layer 15.

The impurity region 17 may have an impurity concentration of $1 \times 10^{19}$ atoms/cm$^3$ or more. For example, the impurity region 17 may have an impurity concentration of $1 \times 10^{20}$ atoms/cm$^3$ to $1 \times 10^{22}$ atoms/cm$^3$.

Figure 11:
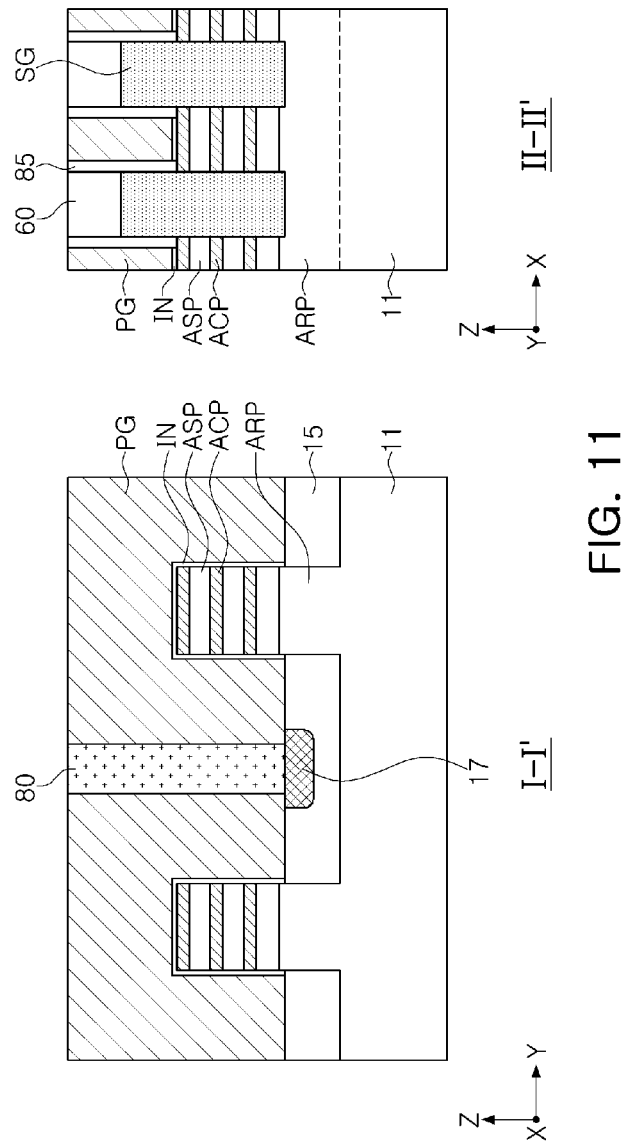

Referring to FIG. 11, the gate separation pattern 80 may be formed in the first opening OP1.

The gate separation pattern 80 may be formed by depositing an insulation material into the first opening OP1 and performing a planarization process on the insulation material. By the planarization process, the capping layer 25 may be removed and the dummy gate electrode PG may be exposed. A lower surface of the gate separation pattern 80 may contact the impurity region 17. The gate separation pattern 80 may include a lower layer and an upper layer that are stacked. For example, the lower layer may be formed of silicon nitride, and the upper layer may be formed of silicon oxide.

Figure 12:
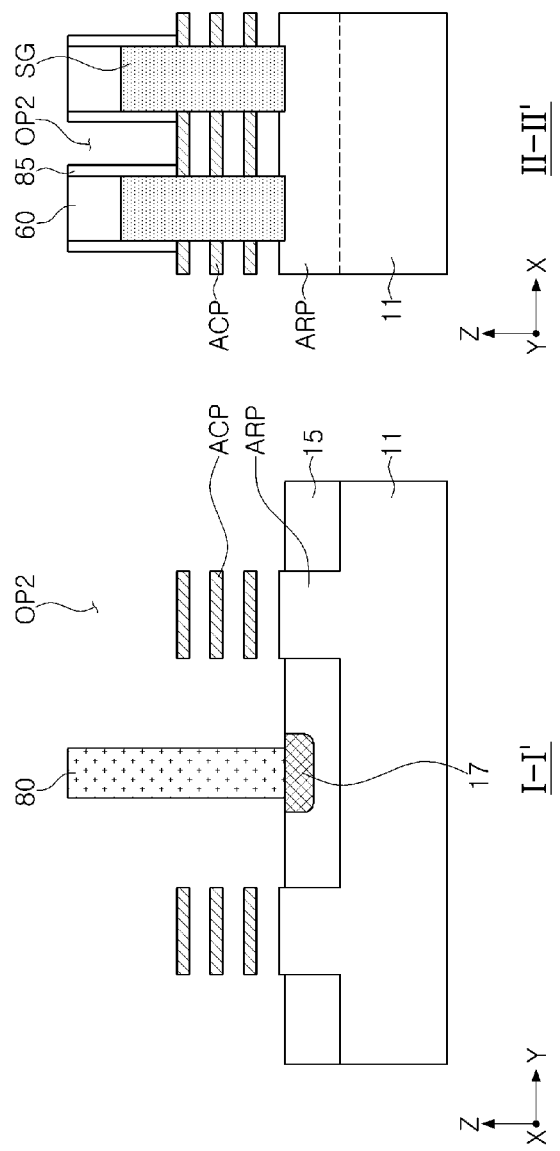

Referring to FIG. 12, a second opening OP2 may be formed to expose the plurality of channel layers ACP.

The dummy gate electrode PG and the dummy insulation layer IN may be sequentially removed, and then the plurality of sacrificial layers ASP may be selectively removed with respect to the plurality of channel layers ACP.

For example, the plurality of channel layers ACP may include silicon, and the plurality of sacrificial layers ASP may include silicon-germanium. To selectively remove the plurality of sacrificial layers ASP, an etchant having a higher etch rate with respect to silicon-germanium than with respect to silicon may be used. For example, to selectively remove the plurality of sacrificial layers ASP, an etch solution containing hydrogen peroxide ($H_2O_2$), hydrofluoric acid (HF) and acetic acid ($CH_3COOH$), an etch solution containing ammonium hydroxide ($NH_4OH$), hydrogen peroxide ($H_2O_2$) and deionized water ($H_2O$) and/or an etch solution containing peracetic acid may be used.

Since the impurity region 17 has a lower etch rate than that of the device isolation layer 15, the device isolation layer 15 below the gate separation pattern 80 may be prevented from being over-etched.

Referring back to FIG. 2, the gate insulation layer GI and the gate electrode (i.e., second gate electrode) GP may be sequentially formed in the second opening OP2.

The gate insulation layer GI may be formed on inner surfaces of the spacers 85, surfaces of the channel layers ACP, portions of surfaces of the source/drains SG that are exposed by the second opening OP2. The gate insulation layer GI may surround the channel layers ACP. The gate insulation layer GI may include a first insulation layer and a second insulation layer that are sequentially stacked and have different dielectric constants. The dielectric constant of the second insulation layer may be greater than that of the first insulation layer. The first insulation layer may be silicon oxide layer, and the second insulation layer may be a high-k dielectric layer.

The gate electrode GP may be formed on the gate insulation layer GI. The gate electrode GP may include a metal, a metal nitride, and/or doped polysilicon.

Referring back to FIG. 2, the gate capping layer 75 may be formed on the gate electrode GP. The gate capping layer 75 may be formed of silicon nitride. The gate capping layer 75 may function as a protection layer to prevent oxygen, etc. from penetrating the gate electrode GP, such that a threshold voltage is not changed A portion of the gate electrode GP may be removed, and then the gate capping layer 75 may be formed in a region in which the portion of the gate electrode is removed.

Figure 13:
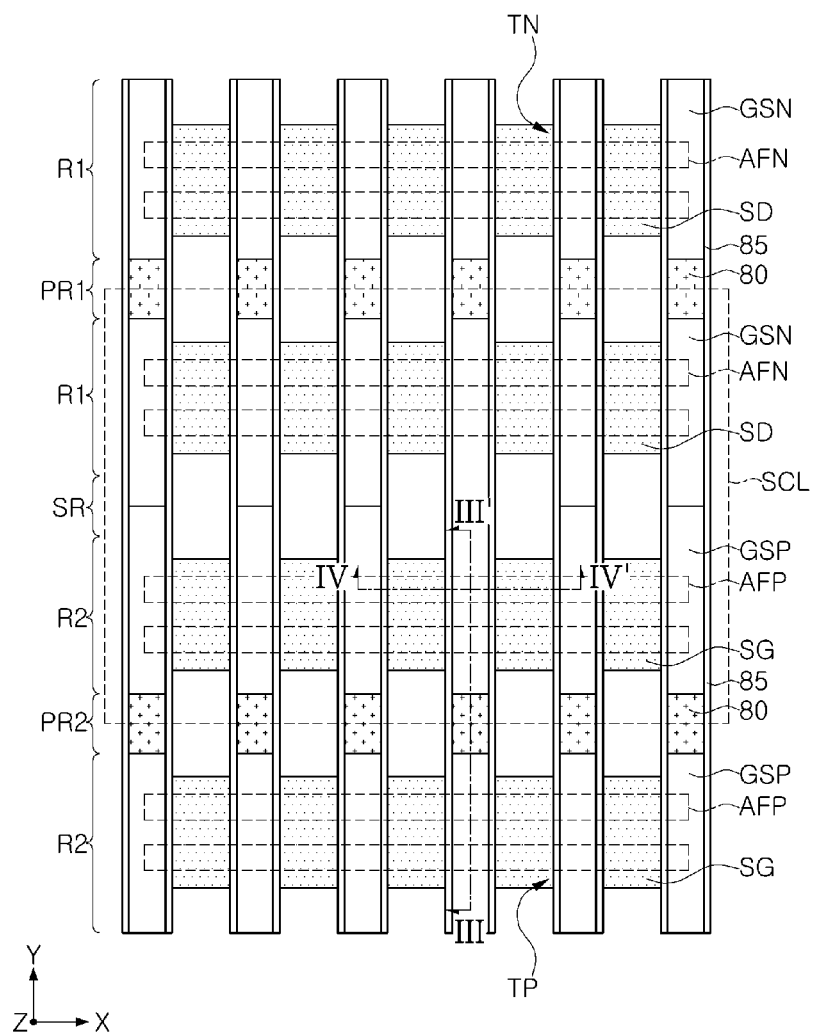
FIG. 13 is a layout diagram illustrating a semiconductor device according to an example embodiment of the present disclosure.
Figure 14:
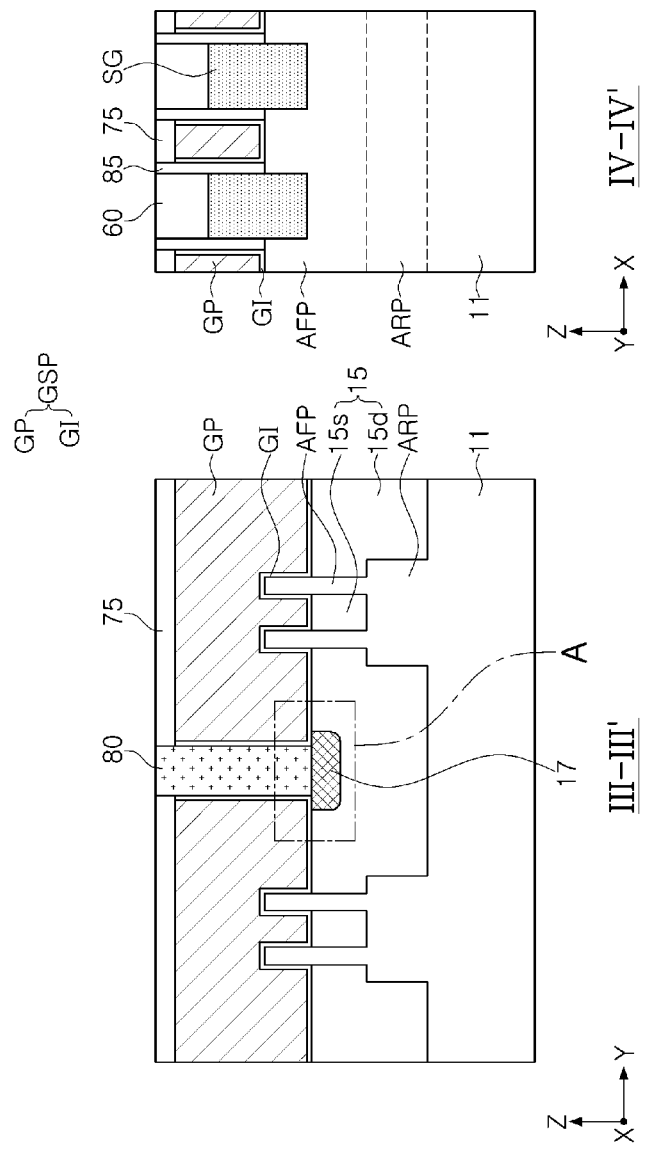
FIG. 14 is a cross-sectional view taken along lines III-II' and IV-IV' of FIG. 13, illustrating a semiconductor device according to example embodiments.

FIG. 13 is a layout diagram illustrating a semiconductor device according to example embodiments of the present disclosure. FIG. 14 is a cross-sectional view taken along lines III-III' and IV-IV' of FIG. 13, illustrating a semiconductor device according to example embodiments of the present disclosure.

Referring to FIG. 13, a semiconductor device, according to example embodiments of the present disclosure, may include the logic standard cells SCL. The logic standard cells SCL may each include the first device region R1, the second device region R2, the separation region SR between the first device region R1 and the second device region R2, the first power rail region PR1 adjacent the first device region R1, and the second power rail region PR2 adjacent the second device region R2.

The n-type transistors TN may be disposed in the first device region R1, and the p-type transistors TP may be disposed in the second device region R2. The n-type transistors TN and the p-type transistors TP may each be a fin-type field effect transistor (FinFET).

In the first device region R1, first fin-type active regions AFN extending in the first direction X, the first gate structures GSN traversing the first fin-type active regions AFN and extending in the second direction Y, the first source/drains SD on the first fin-type active regions AFN between the first gate structures GSN may be formed. In the second device region R2, second fin-type active regions AFP extending in the first direction X, the second gate structures GSP traversing the second fin-type active regions AFP and extending in the second direction Y, the second source/drains SG on the second fin-type active regions AFP between the second gate structures GSP may be formed.

In the illustrated example of FIG. 13, two first fin-type active regions AFN may be disposed in the first device region R1, and two second fin-type active regions AFP may be disposed in the second device region R2. The number of the first fin-type active regions AFN and the second fin-type active regions AFP may be varied. The first fin-type active regions AFN and the second fin-type active regions AFP may protrude from the substrate (see 11 of FIG. 14). The first fin-type active regions AFN may include first active fins, and the second fin-type active regions AFP may include second active fins. The first fin-type active regions AFN and the second fin-type active regions AFP may include silicon and/or germanium.

The n-type transistor TN may include the first fin-type active region AFN, the first gate structure GSN, and the first source/drains SD. The p-type transistor TP may include the second fin-type active region AFP, the second gate structure GSP, and the second source/drains SG.

The gate separation pattern 80 may be disposed between the first gate structures GSN adjacent to each other in the second direction Y and between the second gate structures GSP adjacent to each other in the second direction Y.

The spacers 85 may be disposed on sidewalls of the first gate structures GSN and sidewalls of the second gate structures GSP.

The first source/drains SD and the second source/drains SG may contact the spacers 85.

Referring to FIG. 14, the semiconductor device may include the second lower active regions ARP, the second fin-type active regions AFP protruding from the second lower active regions ARP, the device isolation layer 15 disposed between the second fin-type active regions AFP and between the second lower active regions ARP, the second gate structures GSP covering upper portions of the second fin-type active regions AFP, the gate separation pattern 80 disposed between the second gate structures GSP, the impurity region 17 disposed below the gate separation pattern 80, and the second source/drains SG disposed on the second fin-type active regions AFP. The device isolation layer 15 may include a first isolation layer 15s between the second fin-type active regions AFP and a second isolation layer 15d disposed between the second lower active regions ARP.

The substrate 11 may include a group IV semiconductor, a group III-V compound semiconductor, or a group II-VI compound semiconductor. In some embodiments of the present disclosure, the substrate 11 may be a silicon-on-insulator (SOI) substrate and/or a germanium-on-insulator (GOI) substrate.

The second lower active regions ARP and the second fin-type active regions AFP may include an n-type dopant. The second lower active regions ARP and the second fin-type active regions AFP may include a group IV semiconductor, a group II-V compound semiconductor, and/or a group II-VI compound semiconductor.

The second fin-type active regions AFP may extend in the first direction X, and the second gate structures GSP may cover the upper portions of the second fin-type active regions AFP protruding above the device isolation layer 15 and may extend in the second direction Y crossing the first direction X.

The gate separation pattern 80 may be disposed between the second gate structures GSP adjacent to each other in the second direction Y.

The impurity region 17 may have a lower etch selectivity than that of the device isolation layer 15 and may be disposed below the gate separation pattern 80. The impurity region 17 may refer to a low etch-rate region.

The second gate structures GSP may each include the gate insulation layer GI and the gate electrode GP. The gate insulation layer GI may be disposed between each of the upper portions of the second fin-type active regions AFP and the gate electrode GP, between the device isolation layer 15 and the gate electrode GP, and between a sidewall of the gate separation pattern 80 and the gate electrode GP. An interfacial insulation layer may be further disposed between each of the second fin-type active regions AFP and the gate insulation layer GI.

The gate insulation layer GI may include silicon oxide, silicon nitride, silicon oxynitride, and/or a high-k dielectric material. The gate electrodes GP may be formed of a plurality of layers stacked on the gate insulation layer GI. At least some of the plurality of layers of the gate electrodes GP may be formed of materials different from each other.

The second source/drains SG may be disposed in recess regions in the second fin-type active regions AFP and may extend in the second direction Y. The second source/drains SG may be formed to be integrally coupled to each other on the second fin-type active regions AFP disposed on a single second lower active region ARP, and may have sloped upper surfaces.

The interlayer insulation layer 60 may be disposed on the second source/drains SG. The contact plugs may penetrate the interlayer insulation layer 60 to extend to the second source/drains SG.

The gate capping layer 75 may be disposed on each of the second gate structures GSP.

A portion 'A' of FIG. 14 may be similar to or the same as those described with reference to FIGS. 3 and 4 above.

FIGS. 15 to 20 are cross-sectional views of a method of fabricating a semiconductor device according to example embodiments of the present disclosure and correspond to cross-sectional views taken along lines III-III' and IV-IV' of FIG. 13.

Figure 15:
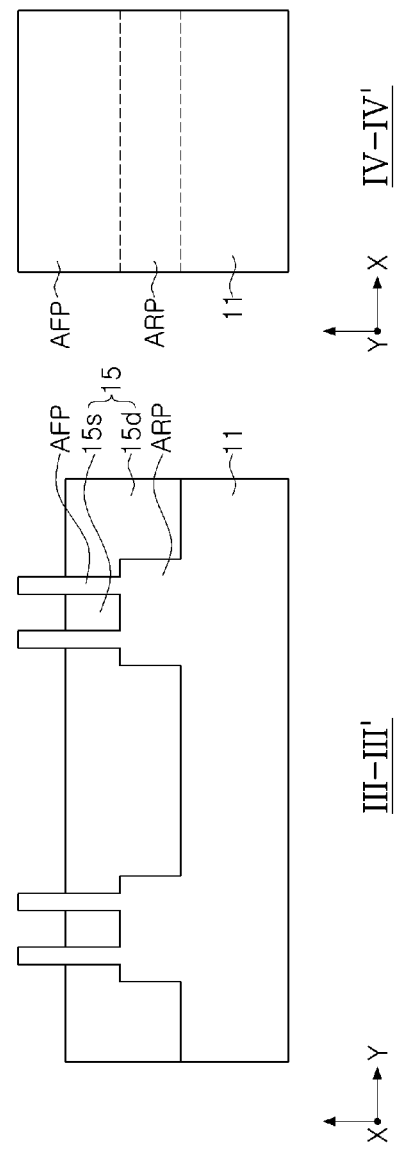
FIGS. 15 to 20 are cross-sectional views of a method of fabricating a semiconductor device according to example embodiments of the present disclosure and correspond to cross-sectional views taken along lines III-III' and IV-IV' of FIG. 13.

Referring to FIG. 15, a portion of the substrate 11 may be etched to form the fin-type active regions (i.e., second fin-type active regions) AFP and the lower active regions (i.e., second lower active regions) ARP. The fin-type active regions AFP and the lower active regions ARP may extend in the first direction X, on the substrate 11. The device isolation layer 15 may be formed in a region in which the portion of the substrate 11 is etched. The device isolation layer 15 may cover sidewalls of the lower active regions ARP and portions of sidewalls of the fin-type active regions AFP. An upper surface of the device isolation layer 15 may be lower than upper surfaces of the fin-type active regions AFP. Upper portions of the fin-type active regions AFP may protrude above the device isolation layer 15. The device isolation layer 15 may include the first isolation layer 15s between the fin-type active regions AFP and the second isolation layer 15d between the lower active regions ARP. The device isolation layer 15 may include, for example, silicon oxide.

Figure 16:
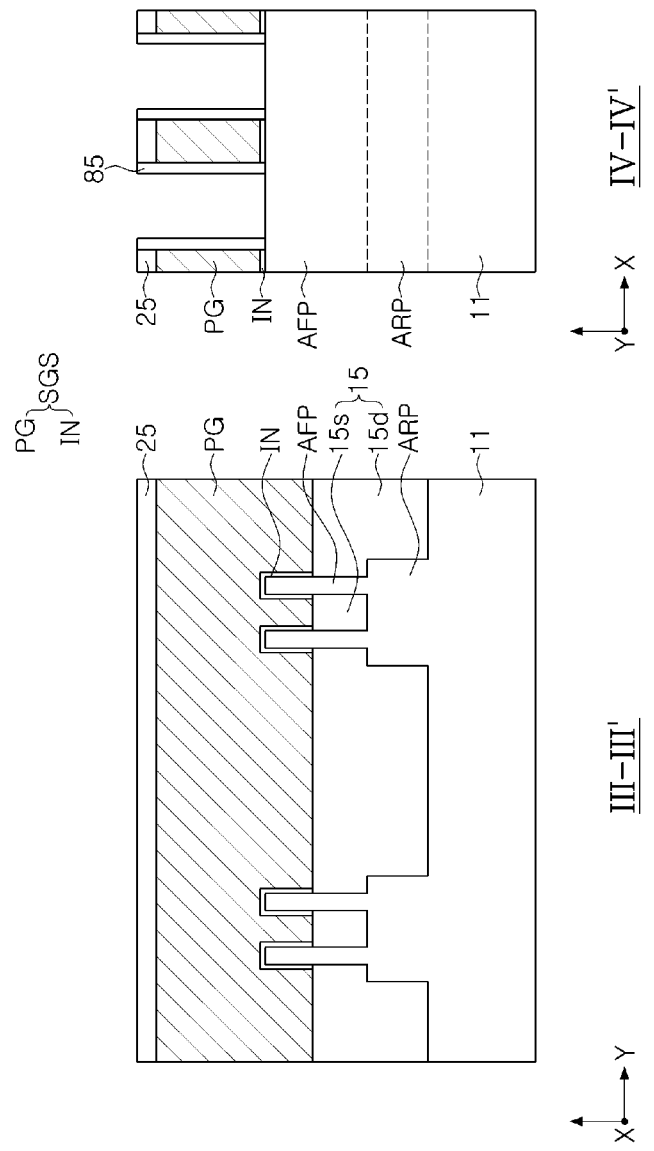

Referring to FIG. 16, the dummy gate structures SGS may be formed to traverse the fin-type active regions AFP. The spacers 85 may be formed on sidewalls of the dummy gate structures SGS. The dummy gate structures SGS may each include a dummy gate electrode PG and the dummy gate insulation layer IN between the dummy gate electrode PG and each of the fin-type active regions AFP. The capping layer 25 may be formed on the dummy gate electrode PG.

The dummy gate structures SGS may be arranged at predetermined intervals spaced in the first direction X. The dummy gate structures SGS may cover the device isolation layer 15 and the upper portions of the fin-type active regions AFP and may extend in the second direction Y. The spacers 85 may extend along the extension direction of the dummy gate structure SGS.

Figure 17:
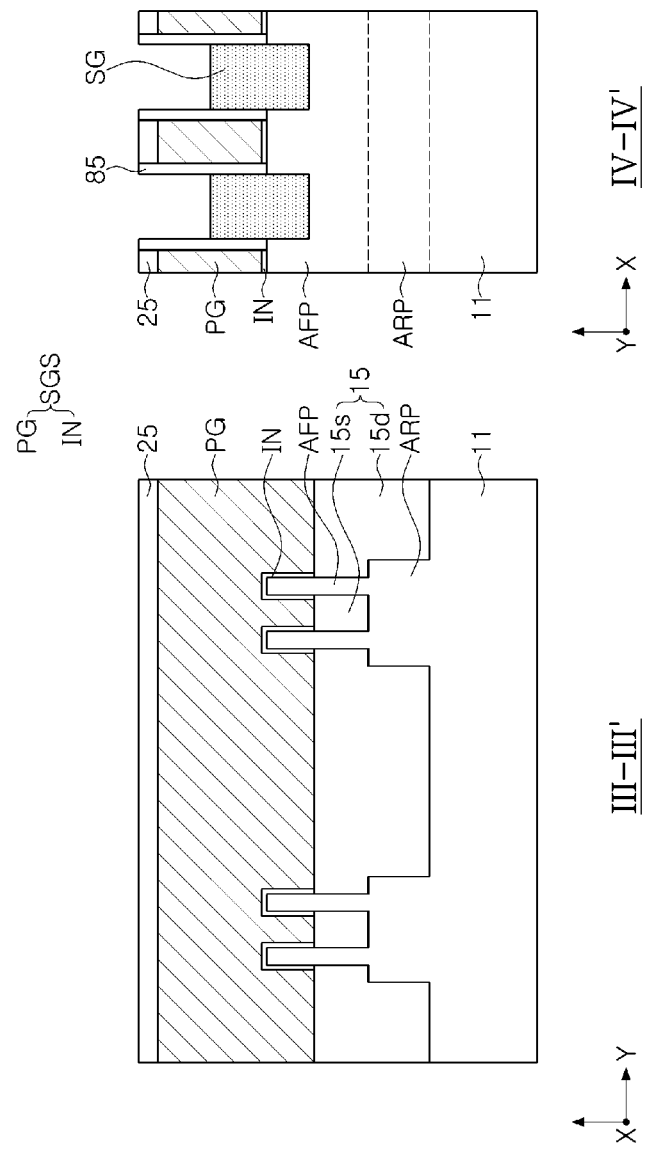

Referring to FIG. 17, portions of the fin-type active regions AFP may be etched by an anisotropic dry etching process using the capping layer 25, each of the dummy gate structure SGS, and the spacers 85 as an etch mask to form recesses between opposite sides of respective ones of the dummy gate structures SGS.

The source/drains (i.e., the second source/drains), e.g., p-type source/drains, SG may be formed by a selective epitaxial growth process using the fin-type active regions AFP as a seed.

Figure 18:
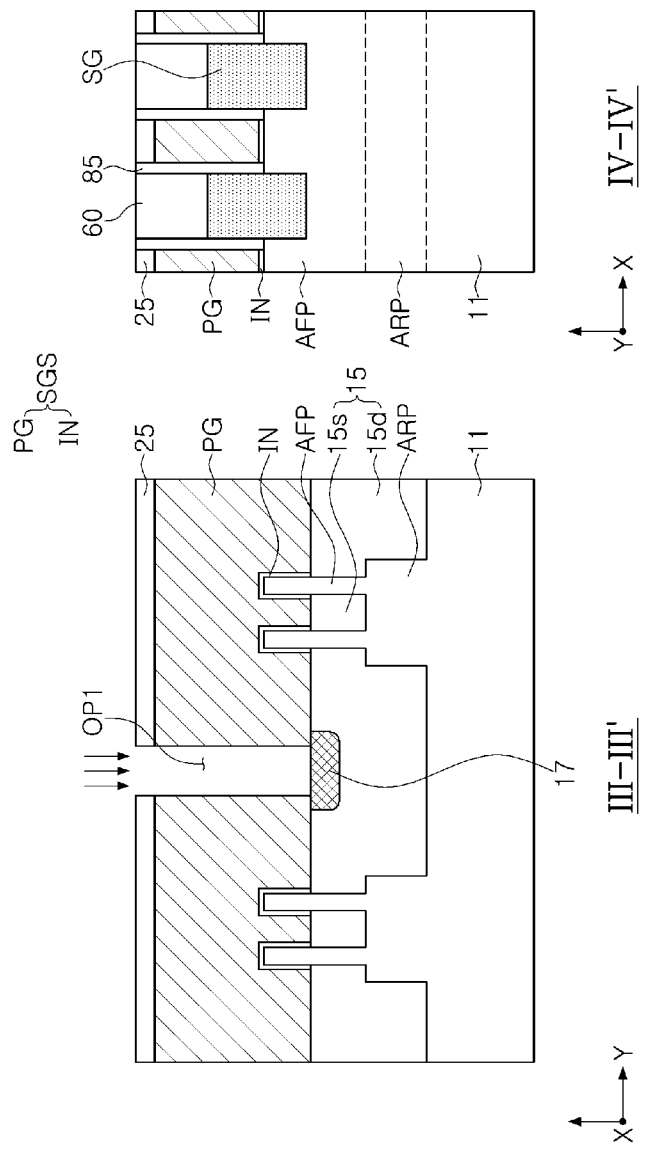

Referring to FIG. 18, the interlayer insulation layer 60 may be formed to cover the source/drains SG. The interlayer insulation layer 60 may fill spaces between the spacers 85. The capping layer 25 and the dummy gate electrode PG may be etched to form the first opening OP1.

The first opening OP1 may be formed by forming a mask pattern on the capping layer 25 and the interlayer insulation layer 60 and etching the capping layer 25 and the second dummy gate electrode PG by an anisotropic etching process using the mask pattern as an etch mask. The first opening OP1 may expose the device isolation layer 15.

Impurities may be injected into an upper portion of the device isolation layer 15 by an ion implantation process to form the impurity region 17. For example, the device isolation layer 15 may include silicon oxide, and the impurity region 17 may further Si, B, He, P and/or C in comparison to the device isolation layer 15. The impurity region 17 may have an impurity concentration of $1\times10^{19}$ atoms/cm$^3$ or more. For example, the impurity region 17 may have an impurity concentration of $1\times10^{20}$ atoms/cm$^3$ to $1\times10^{22}$ atoms/cm$^3$. According to an exemplary embodiment of the present disclosure, the first opening OP1 and the impurity region 17 may be formed before the recesses are formed between opposite sides of respective ones of the dummy gate structures SGS.

Figure 19:
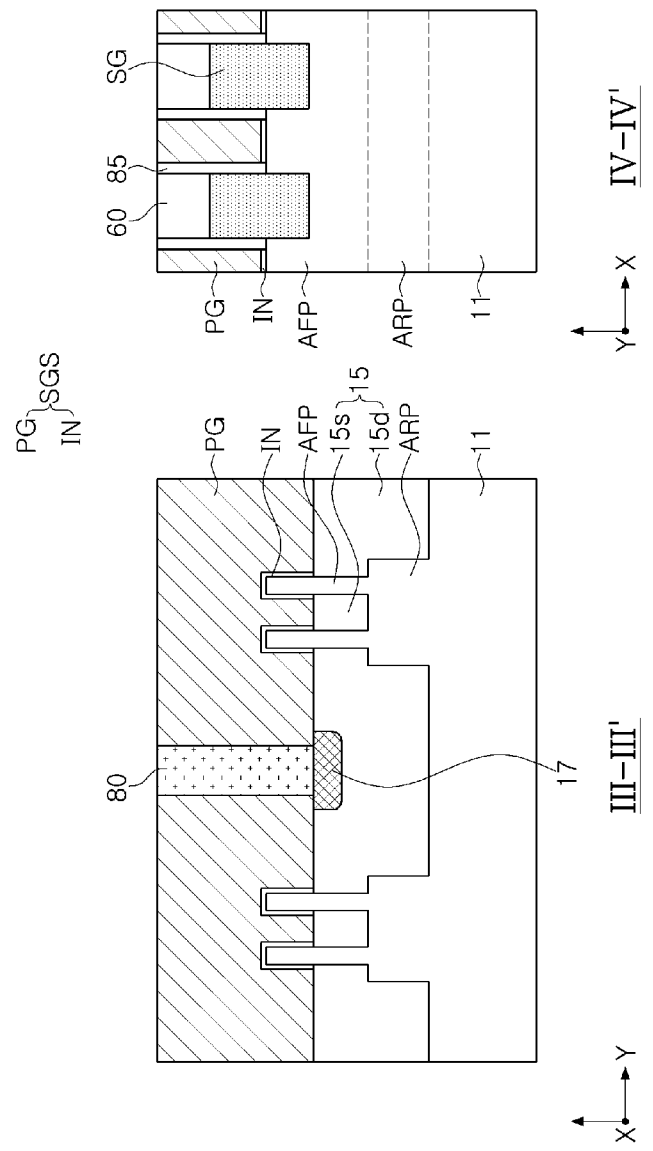

Referring to FIG. 19, the gate separation pattern 80 may be formed in the first opening OP1.

The gate separation pattern 80 may be formed by depositing an insulating material and performing a planarization process on the insulating material. By the planarization, the capping layer 25 may be removed to expose the dummy gate electrode PG. A lower surface of the gate separation pattern 80 may contact the impurity region 17.

Figure 20:
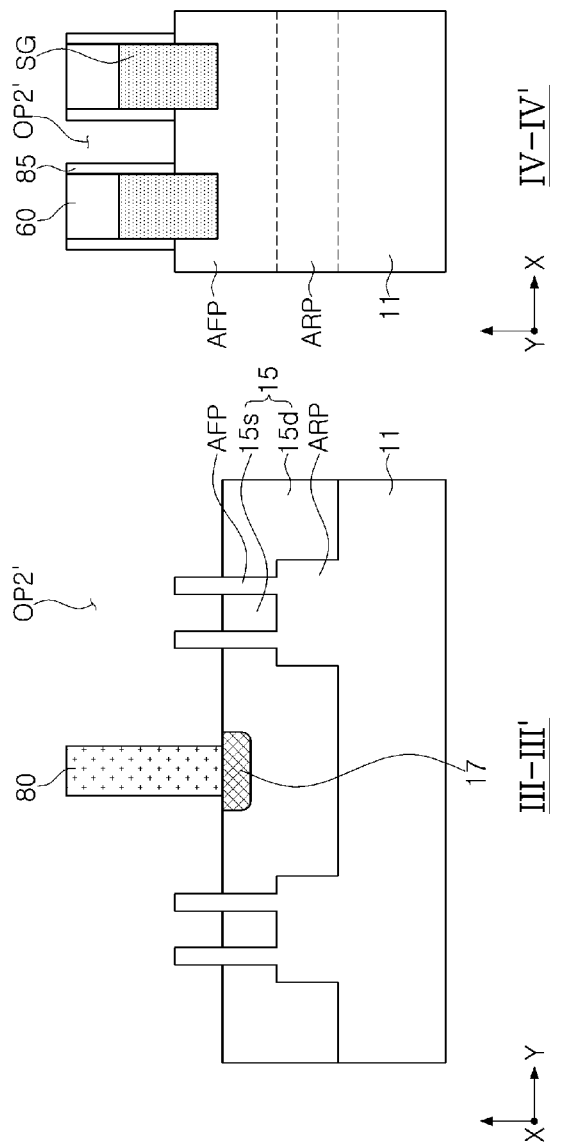

Referring to FIG. 20, a second opening OP2' may be formed to expose the upper portion of the plurality of fin-type active regions AFP.

First, the dummy gate electrode PG and the dummy insulation layer IN may be sequentially removed. At that time, since the impurity region 17 having a low etch rate with respect to the device isolation layer 15 is present, the device isolation layer 15 below the gate separation pattern 80 may be prevented from being over-etched.

Referring back to FIG. 14, the gate insulation layer GI and the gate electrode (i.e., the second gate electrode) GP may be sequentially formed in the second opening OP2'.

The gate insulation layer GI may be formed on inner surfaces of the spacers 85, surfaces of the upper portions of the fin-type active regions AFP, sidewalls of the gate separation pattern 80, and an upper surface of the device isolation layer 15 that are exposed by the second opening OP2'. The gate insulation layer GI may include a first insulation layer and a second insulation layer that are sequentially stacked and have different dielectric constants. The dielectric constant of the second insulation layer may be greater than that of the first insulation layer.

The gate electrode GP may be formed on the gate insulation layer GI. The gate capping layer 75 may be formed on the gate electrode GP.

In the semiconductor device, according to example embodiments of the present disclosure, the impurity region 17 may be formed in the device isolation layer 15 below the gate separation pattern 80, such that the etch rate of the device isolation layer 15 may be reduced. Accordingly, bridging defect (a short) between the adjacent gate electrodes GP may be prevented, thus increasing the yield or reliability of the semiconductor device.

While the present inventive concepts have been particularly shown and described with reference to example embodiments thereof, it will be understood by those of ordinary skill in the art that various changes in form and details may be made therein without departing from the spirit and scope of the present disclosure.

What is claimed is:

1. A semiconductor device comprising:
a substrate;
an active region disposed on the substrate and extending in a first direction;
a device isolation layer adjacent to the active region;
a gate structure disposed on the active region, the gate structure extending in a second direction crossing the first direction and covering a portion of the device isolation layer;
a gate separation pattern contacting an end of the gate structure; and
an impurity region disposed below the gate separation pattern and on the device isolation layer,
wherein the device isolation layer surrounds a bottom surface and at least two side surfaces of the impurity region in a cross-sectional view, and a top surface of the impurity region is in contact with the gate separation pattern.

2. The semiconductor device of claim 1, wherein a width of the impurity region is greater than a width of the gate separation pattern.

3. The semiconductor device of claim 1, wherein a sidewall of the impurity region has a stepped portion.

4. The semiconductor device of claim 1, wherein an upper surface of the impurity region is higher than an upper surface of the portion of the device isolation layer covered by the gate structure.

5. The semiconductor device of claim 1, wherein a portion of the gate structure extends below the gate separation pattern.

6. The semiconductor device of claim 1, wherein a lower surface of the gate structure is lower than a lower surface of the gate separation pattern.

7. The semiconductor device of claim 1, wherein the device isolation layer includes silicon oxide, and wherein the impurity region includes silicon oxide including Si, B, He, P and/or C.

8. The semiconductor device of claim 1, wherein an impurity concentration of the impurity region ranges from $1\times10^{20}$ atoms/cm$^3$ to $1\times10^{22}$ atoms/cm$^3$.

9. The semiconductor device of claim 1, further comprising a plurality of channel layers disposed on the active region and spaced apart from each other in a vertical direction perpendicular to an upper surface of the substrate, wherein the gate structure surrounds the plurality of channel layers.

10. A semiconductor device comprising:
a substrate;
a plurality of active regions disposed on the substrate;
a device isolation layer adjacent to the plurality of active regions;
a plurality of gate structures at least partially overlapping the plurality of active regions and contacting the device isolation layer;
a gate separation pattern disposed between adjacent gate structures of the plurality of gate structures and on the device isolation layer; and
a low etch-rate region disposed between the gate separation pattern and the device isolation layer,
wherein the low etch-rate region has a lower etch-rate than the device isolation layer, and
wherein the device isolation layer surrounds a bottom surface and at least two side surfaces of the low etch-rate region in a cross-sectional view, and a top surface of the etch-rate region is in contact with the gate separation pattern.

11. The semiconductor device of claim 10, wherein a width of the low etch-rate region is greater than a width of the gate separation pattern.

12. The semiconductor device of claim 10, wherein a sidewall of the low etch-rate region includes a stepped portion.

13. The semiconductor device of claim 10, wherein an upper surface of the low etch-rate region is higher than an upper surface of a portion of the device isolation layer below the plurality of gate structures in a third direction that extends away from the substrate.

14. The semiconductor device of claim 10, wherein a portion of each of the plurality of gate structures extends below the gate separation pattern.

15. The semiconductor device of claim 10, wherein the device isolation layer includes silicon oxide, wherein the low etch-rate region includes an impurity, and wherein the impurity includes Si, B, He, P and/or C.

16. The semiconductor device of claim 15, wherein a concentration of the impurity in the low etch-rate region ranges from $1\times10^{20}$ atoms/cm$^3$ to $1\times10^{22}$ atoms/cm$^3$.

17. The semiconductor device of claim 10, further comprising a plurality of channel layers on each of the active regions and spaced apart from each other in a vertical direction perpendicular to an upper surface of the substrate, wherein each of the plurality of gate structures surrounds the plurality of channel layers.

* * * * *